(12) United States Patent
Ivanov et al.

(10) Patent No.: US 8,906,446 B2
(45) Date of Patent: *Dec. 9, 2014

(54) APPARATUS AND METHOD FOR ELECTROLESS DEPOSITION OF MATERIALS ON SEMICONDUCTOR SUBSTRATES

(75) Inventors: Igor C. Ivanov, Dublin, CA (US); Jonathan Weiguo Zhang, San Jose, CA (US); Artur Kolics, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/408,039

(22) Filed: Feb. 29, 2012

(65) Prior Publication Data

US 2012/0213914 A1    Aug. 23, 2012

Related U.S. Application Data

(60) Continuation of application No. 11/138,531, filed on May 26, 2005, now Pat. No. 8,128,987, which is a division of application No. 10/103,015, filed on Mar. 22, 2002, now Pat. No. 6,913,651.

(51) Int. Cl.
*C23C 18/16* (2006.01)
*H01L 21/288* (2006.01)

(52) U.S. Cl.
CPC ......... *C23C 18/1676* (2013.01); *C23C 18/1632* (2013.01); *C23C 18/1682* (2013.01); *C23C 18/1628* (2013.01); *C23C 18/163* (2013.01); *C23C 18/168* (2013.01); *H01L 21/288* (2013.01)
USPC ................. 427/99.5; 427/437; 427/443.1

(58) Field of Classification Search
CPC ............ C23C 18/1628; C23C 18/163; C23C 18/1632; C23C 18/1676; C23C 18/168; C23C 18/1682
USPC ......................................... 427/99.5
See application file for complete search history.

(56) References Cited

U.S. PATENT DOCUMENTS 3,895,137 A    7/1975   Avramidis et al.
4,594,273 A *  6/1986   Doss et al. ............. 427/443.1
(Continued)

OTHER PUBLICATIONS

Lopatin, "Electroless Growth of 10-100 nm Copper Films," Advanced Metallization Conference, Oct. 1999, pp. 181-185.

(Continued)

*Primary Examiner* — Katherine A Bareford
(74) *Attorney, Agent, or Firm* — Beyer Law Group LLP (57) ABSTRACT

An apparatus is provided having a closable chamber that can be sealed and is capable of withstanding an increased pressure and high temperature. The chamber has several inlet ports for the supply of various process liquids, such as deposition solutions, DI water for rinsing, etc., and a port for the supply of a gas under pressure. The apparatus also includes a solution heater and a control system for controlling temperature and pressure in the chamber. Uniform deposition is achieved by carrying out the deposition process under pressure and under temperature slightly below the boiling point of the solution. The solution can be supplied from above via a shower head formed in the cover, or through the bottom of the chamber. Rinsing or other auxiliary solutions are supplied via a radially moveable chemical dispensing arm that can be arranged above the substrate parallel thereto.

13 Claims, 6 Drawing Sheets

(56) References Cited

U.S. PATENT DOCUMENTS

| | | | |
|---|---|---|---|
| 4,788,994 A | 12/1988 | Shinbara | |
| 4,952,509 A * | 8/1990 | Wegner et al. | 435/301.1 |
| 5,127,362 A | 7/1992 | Iwatsu et al. | |
| 5,500,315 A | 3/1996 | Calvert et al. | |
| 5,571,560 A | 11/1996 | Lin | |
| 5,580,607 A | 12/1996 | Takekuma et al. | |
| 5,688,322 A | 11/1997 | Motoda et al. | |
| 5,830,805 A | 11/1998 | Shacham-Diamand et al. | |
| 6,017,437 A * | 1/2000 | Ting et al. | 205/80 |
| 6,065,424 A | 5/2000 | Shacham-Diamand et al. | |
| 6,248,398 B1 | 6/2001 | Talieh et al. | |
| 6,309,524 B1 | 10/2001 | Woodruff et al. | |
| 6,451,114 B1 * | 9/2002 | Stevens | 118/50 |
| 6,548,111 B1 | 4/2003 | Shirley | |
| 6,638,564 B2 * | 10/2003 | Segawa et al. | 427/8 |
| 6,824,612 B2 | 11/2004 | Stevens et al. | |
| 8,128,987 B2 * | 3/2012 | Ivanov et al. | 427/99.5 |
| 2003/0049939 A1 * | 3/2003 | Worm et al. | 438/745 |
| 2003/0134047 A1 | 7/2003 | Dubin et al. | |

OTHER PUBLICATIONS

Riedel, "Electroless Nickel Plating," Finishing Publications Ltd., 1991, p. 39.

Lantasov et al., "New plating bath for electroless copper deposition on sputtered barrier layers," Microelectronics Engineering, No. 50, 2000, Fig. 2 at p. 443.

* cited by examiner

APPARATUS AND METHOD FOR ELECTROLESS DEPOSITION OF MATERIALS ON SEMICONDUCTOR SUBSTRATES

CONTINUING DATA

This application is a continuation from prior application Ser. No. 11/138,531 filed May 26, 2005, now U.S. Pat. No. 8,128,987, which is a divisional from prior application Ser. No. 10/103,015 filed Mar. 22, 2002, now U.S. Pat. No. 6,913,651.

FIELD OF THE INVENTION

The present invention relates to the field of semiconductor production, in particular, to an apparatus and a method for electroless deposition of materials on semiconductor substrates.

BACKGROUND OF THE INVENTION

Manufacturing of semiconductor devices, in particular integrated circuits having multiple-layered structures with various metal and non-metal layers laminated on a semiconductor substrate, typically involves an application of several metal layers onto a substrate or onto other previously deposited layers. These layers may have a complicated planar topology since these layers may constitute thousands of individual devices, which in combination form an integrated circuit or so-called "chip". Modern chips may have metal or dielectric layers with thicknesses from tens of Angstroms to fractions of a micron.

It is understood that thin metallic films used in integrated circuits of semiconductor devices function as conductors of electric current. Furthermore, it is known that densities of signal currents in metallic interconnections used in integrated circuit may reach extremely high values that generate such phenomena as electromigration associated with spatial transfer of mass of conductor films. Therefore the characteristics and properties of the deposited metal films (uniformity of film thickness, low electrical resistivity, etc.) determine performance characteristics and quality of the integrated circuit and of the semiconductor device as a whole.

In view of the above, thin metal films used in integrated circuits should satisfy very strict technical requirements relating to metal deposition processes, as well as to repeatability and controllability of the aforementioned processes.

A wide range of metals is utilized in the microelectronic manufacturing industry for the formation of integrated circuits. These metals include, for example, nickel, tungsten, platinum, copper, cobalt, as well as alloys of electrically conductive compounds such as silicides, solders, etc. It is also known that coating films are applied onto substrates with the use of a variety of technological processes such chemical vapor deposition (CVD), physical vapor deposition (PVD), electroplating, and electroless plating. Of these techniques, electroplating and electroless plating tend to be the most economical and most promising for improvement in characteristics of the deposited films. Therefore, electroplating and electroless plating techniques successfully replaces other technologies.

Electroplating and electroless plating can be used for the deposition of continuous metal layers as well as patterned metal layers. One of the process sequences used by the microelectronic manufacturing industry to deposit a metal onto semiconductor wafers is known to as "damascene" processing. In such processing, holes, commonly called "vias", trenches and/or other recesses are formed on a workpiece and filled with a metal, such as copper. In the damascene process, the wafer, with vias and trenches etched in the dielectric material, is first provided with a metallic seed layer, which is used to conduct electrical current during a subsequent metal electroplating step. If a metal such as copper is used, the seed layer is disposed over a barrier layer material, such as Ti, TiN, etc. The seed layer is a very thin layer of metal, which can be applied using one or more of several processes. For example, the seed layer of metal can be laid down using physical vapor deposition or chemical vapor deposition processes to produce a layer with the thickness on the order of 1,000 Angstroms. The seed layer can advantageously be formed of copper, gold, nickel, palladium, or other metals. The seed layer is formed over a surface, which may contain vias, trenches, or other recessed device features.

A metal layer is then electroplated onto the seed layer in the form of a continuous layer. The continuous layer is plated to form an overlying layer, with the goal of providing a metal layer that fills the trenches and vias and extends a certain amount above these features. Such a continuous layer will typically have a thickness on the order of 5,000 to 15,000 Angstroms (0.5-1.5 microns).

After the continuous layer has been electroplated onto the semiconductor wafer, excess metal material present outside of the vias, trenches, or other recesses is removed. The metal is removed to provide a resulting pattern of metal layer in the semiconductor integrated circuit being formed. The excess plated material can be removed, for example, using chemical mechanical planarization. Chemical mechanical planarization is a processing step, which uses the combined action of chemical removal agents, or a chemical removal agents with an abrasive, which grinds and polishes the exposed metal surface to remove undesired parts of the metal layer applied in the electroplating step.

Disadvantages associated with electroplating are technical problems in connection with designing of reactors used in the electroplating of semiconductor wafers. Utilization of a limited number of discrete electrical contacts (e.g., 8 contacts) with the seed layer about the perimeter of the wafer ordinarily produces higher current densities near the contact points than at other portions of the wafer. This non-uniform distribution of current across the wafer, in turn, causes non-uniform deposition of the plated metallic material. Current thieving, affected by the provision of electrically conductive elements other than those, which contact the seed layer, can be employed near the wafer contacts to minimize such non-uniformity. But such thieving techniques add to the complexity of electroplating equipment, and increase maintenance requirements.

Another problem associated with electroplating of wafers concerns efforts to prevent the electric contacts themselves from being plated during the electroplating process. Any material plated to the electrical contacts must be removed to prevent changing contact performance. While it is possible to provide sealing mechanisms for discrete electrical contacts, such arrangements typically cover a significant area of the wafer surface, and can add complexity to the electrical contact design.

The specific metal to be electroplated can also complicate the electroplating process. For example, electroplating of certain metals typically requires use of a seed layer having a relatively high electrical resistance. As a consequence, use of the typical plurality of electrical wafer contacts (for example, eight discrete contacts) may not provide adequate uniformity of the plated metal layer on the wafer. Reduction in sizes of such features as vias and trenches also requires thinner layers having higher resistivity, which in turn may generate a high potential drop from the wafer edges to the central part, whereby the rate of deposition in the central area is significantly reduced.

Beyond the contact-related problems discussed above, there are also other problems associated with electroplating reactors. As device sizes decrease, the need for tighter control over the processing environment increases. This includes control over the contaminants that affect the electroplating process. The moving components of the reactor, which tend to generate such contaminants, should therefore be subject to strict isolation requirements.

Still further, existing electroplating reactors are often difficult to maintain and/or reconfigure for different electroplating processes. Such difficulties must be overcome if an electroplating reactor design is to be accepted for large-scale manufacturing.

One drawback associated with copper deposition by electroplating is the fact that for very small features on microelectronic workpieces (sub 0.1 micron features), copper deposition by electroplating can lack conformity with the side walls of high aspect ratio vias and trenches, and can produce voids in the formed interconnects and plugs (vias). This is often due to the non-conformity of the copper seed layer deposited by PVD or CVD. As a result, the seed layer may not be thick enough to carry the current to the bottom of high aspect ratio features.

An alternate process for depositing copper onto a microelectronic workpiece is known as "electroless" plating which is the deposition of metals on a catalytic surface from a solution without an external source of current. For example, this process can be used as a preliminary step in preparing plastic articles for conventional electroplating. After cleaning and etching, the plastic surface is immersed in solutions that react to precipitate a catalytic metal in situ, palladium, for example. First the plastic is placed in an acidic stannous chloride solution, then into a solution of palladium chloride; palladium is reduced to its catalytic metallic state by the tin. Another way of producing a catalytic surface is to immerse the plastic article in a colloidal solution of palladium followed by immersion in an accelerator solution. The plastic article thus treated can now be plated with nickel or copper by the electroless method, which forms a conductive surface, which then can be plated with other metals by the conventional electroplating method.

Along with the electroplating method, the electroless method also has found wide application in the manufacture of semiconductor devices.

As compared to electroplating, electroless plating is a selective process, which can be realized with very thin seeds or without the use of seeds at all. Since an electroless process is not associated with the use of an electric current source, electroless plating results in more uniform coatings in view of the absence of discrete contacts. Electroless plating can be realized with the use of simple and inexpensive equipment and with a high aspect ratio gap fill.

Given below are several examples of methods and apparatuses for electroless plating, specifically for use in the manufacture of semiconductor devices.

U.S. Pat. No. 5,500,315 issued in 1996 to J. Calvert, et al. discloses an electroless metal plating-catalyst system that overcomes many of the limitations of prior systems. In one aspect of the invention, a process is provided comprising steps of providing a substrate comprising one or more chemical groups capable of ligating to an electroless plating catalyst, at least a portion of the chemical groups being chemically bonded to the substrate; contacting the substrate with the electroless metal plating catalyst; and contacting the substrate with an electroless metal plating solution to form a metal deposit on the substrate. The chemical groups can be, for example, covalently bonded to the substrate. In another preferred aspect, the invention provides a process for selective electroless metallization, comprising steps of selectively modifying the reactivity of a substrate to an electroless metallization catalyst; contacting the substrate with the electroless metallization catalyst; and contacting the substrate with an electroless metallization solution to form a selective electroless deposit on the substrate. The substrate reactivity can be modified by selective treatment of catalyst ligating groups or precursors thereof on the substrate, for example by isomerization, photocleavage or other transformation of the ligating or precursor groups. Such-direct modification enables selective plating in a much more direct and convenient manner than prior selective plating techniques. Specifically, the aforementioned patent provides selective electroless plating without the use of a photoresist or an adsorption type tin-containing plating catalyst.

The method described in the above patent includes an electroless catalyst system that requires fewer and simpler processing steps in comparison to current Pd/Sn colloid catalyst adsorption based systems; use of more stable and convenient catalysts, including tin-free catalysts; and improved catalyst adhesion to a substrate allowing plating of more dense initiation and of greater uniformity and selectivity. The invention also provides selective patterning of substrate ligating groups, thereby enabling a selective metal deposit without the use of a conventional photoresist patterning sequence.

U.S. Pat. No. 6,309,524 granted to D. Woodruff, et al. in 2001 discloses a universal electroplating/electroless reactor for plating a metal onto surfaces of workpieces. An integrated tool for plating a workpiece comprises a first processing chamber for plating the workpiece using an electroless plating process and a second processing chamber for plating the workpiece using an electroplating process. A robotic transfer mechanism is used that is programmed to transfer a workpiece to the first processing chamber for electroless plating thereof and, in a subsequent operation, to transfer the workpiece to the second processing chamber for electroplating thereof.

It should be noted that a common problem in using bathes, which is especially true for the electroless deposition process, is that foreign particles or contaminants will be deposited on the substrate surface of the wafer when transferring the wafers from one bath to another bath. Another common problem is the exposure of the substrate surface of the wafer to air during the transfer (from bath to bath) can cause the non-wetting of deep and narrow trenches in the surface or small (contact) holes in the surface because of electrolyte evaporation. And yet another common problem is that exposure to air may cause oxidation of the catalytic surface that will result in poor catalytic activity and poor quality metal deposits. This problem becomes especially troublesome when using materials that easily oxidize in air such as copper. To produce high quality metal deposits in the submicron range, therefore, it is more desirable not to transfer the wafer between the process chambers and to avoid exposing the wafer to air by using a single bath or process chamber and moving the different fluids for each step in the process through the process chamber.

The above problems are solved by the system described in U.S. Pat. No. 5,830,805 issued in 1998 to Y. Shacham-Diamand, et al. This patent discloses an electroless deposition apparatus and method of performing electroless deposition for processing a semiconductor wafer that uses a closed process chamber to subject the wafer to more than one processing fluid while retaining the wafer within the chamber. The invention is useful for manufacturing processes that include depositing, etching, cleaning, rinsing, and/or drying. The process chamber used in the preferred embodiment of the apparatus of the above patent is an enclosed container capable of holding one or more semiconductor wafers. A distribution system introduces a first fluid into the chamber for processing the wafer and then removes the first fluid from the chamber after processing the wafer. The distribution system then introduces the next fluid into the chamber for processing the wafer and then removes the next fluid from the chamber after processing the wafer. This procedure continues until the manufacturing process finishes. The fluids used in the present invention depends on the process performed and may include fluids such as Dl water, $N_2$ for flushing, and electrolytic solutions comprising reducing agents, complexing agents, or pH adjusters.

The fluid enters the sealed process chamber through an inlet, and exits the chamber through an outlet. As the fluid enters the process chamber, the fluid is dispersed across the wafer in a uniform flow. A recirculation system moves the fluid through the process chamber using a temperature control system, chemical concentration monitoring system, pump system, and a filtration system before re-circulating the fluid back through the process chamber.

Additional embodiments include: a rotatingly mounted tubular wafer housing with a wafer mounted on either or both sides of the housing surface; an inner core mounted inside of the tubular housing when mounting a wafer on the inside surface of the housing; and a dispersal apparatus for dispersing the fluid in a uniform flow over the wafer. The processing chamber can be provided with a heater and a temperature control system.

In spite of their advantages, the known electroless processes have temperature of the working chemical solution as one of the main parameters. It is known that speed of deposition in an electroless process depends on the temperature in a degree close to exponential. For example, in an article published in Electroless Nickel Plating, Finishing Publications Ltd., 1991, W. Riedel states (page 39 of the article) that temperature is the most important of parameters affecting the deposition rate and that for Ni—P electroless process the deposition rate increases twofold for every 10 degrees of bath temperature.

Furthermore, for the metal interconnects on the surface of the wafer one of the major requirements is low resistivity. Copper was chosen as the close second best for fulfilling this requirement. However, due to the presence of various additives in the interface between the PVD Cu seeds and ECD (electroplating copper deposition) Cu, resistivity is disproportionally increased as compared to the one in much thinner electroless-deposited Cu layer. This phenomenon was reported by S. Lopatin at AMC, 2001.

It has been also shown by Y. Lantasov, et al. in "Microelectronics Engineering", No. 50 (2000), pp. 441-447, FIG. 2, that resistivity of ELD Cu strongly depends on deposition conditions, and that at higher temperatures it is possible to obtain a material with low resistivity.

However, it is understood that electroless plating at high temperatures leads to significant non-uniformities in the deposited layers. This occurs due to local temperature fluctuations. The higher the temperature, the greater such fluctuations. Stabilization of elevated temperatures in large volumes of the solution tanks is associated with the use of complicated temperature control systems and temperature maintaining systems (seals, thermal insulations, etc.). This, in turn, increases the cost of the equipment and maintenance.

For the reasons described above, manufacturers of semiconductor equipment prefer to use electroless processes carried out at room temperature. Low speeds of deposition are compensated by utilizing a multiple-station deposition equipment with simultaneous operation of a number of substrates in a number of chambers arranged in series. Such equipment requires a large production space and dictates the use of large volumes of the solutions. Furthermore, an additional space is needed for the preparation, storage, and post-use treatment of the solutions. This, in turn, creates environmental problems.

Another common drawback of existing electroless deposition apparatuses is low speed of deposition, which in general depends on the type of the deposited material and even in the best case does not exceed 100 nm/min, but normally is much lower. For example, for CoWP the speed of deposition can be within the range from 5 nm/min to 10 nm/min.

SUMMARY OF THE INVENTION

It is an object of the present invention to provide a method and an apparatus for electroless plating at high temperatures with high uniformity of the deposited layers. Still another object is to provide an electroless deposition apparatus which is simple and compact in construction, inexpensive to manufacture, universal in use due to an accommodation of various processes such as cleaning, etching, activation, hot DI flushing, evacuation, purging, chamber draining, wafer drying, etc. Another object is to provide a method and apparatus for electroless plating at high temperatures in combination with increased pressures which ensures high speed of electroless deposition and formation of metal film of high uniformity and low resistivity or high quality of the deposited material unattainable with conventional techniques.

The method of the invention consists in that electroless plating of a coating material, which may be a metal, semiconductor, or dielectric, is deposited at increased temperatures and pressures of the working solution or at a working temperature slightly below the boiling point, e.g., by 25%. The deposition may be carried out at a pressure that is below or higher than normal. By adjusting the pressure it becomes possible to adjust the temperature of the solution, and because the pressure can be adjusted in a wide range, the boiling point of the deposition solution also can be adjusted in a sufficiently wide range. However, since the deposition exactly at the boiling point may cause random non-uniformity of deposition because of gas bubbles, the working temperature is constantly maintained at a predetermined level slightly below the boiling point, e.g., from 0 to 25% below the boiling point. Since stabilization of pressure provides stable pressure uniformly in the entire volume of the working chamber (due to Pascal Law), it becomes possible to provide stable near-boiling temperature, which is constant for each predetermined pressure. Therefore it becomes possible to provide extremely uniform deposition rate over the entire surface of a horizontally arranged substrate with the treated surface facing upward.

For example, the boiling point of an aqueous deposition solution is approximately 100° C., and therefore, because of intensive evaporation, it would be difficult to carry out deposition even at 90° C. However, in an enclosed pressurized vessel at a pressure, e.g., of 2 atm, the boiling point will be raised to 120° C. Therefore, under such pressure the deposition process could be easily carried out at 100° C.

The authors are not aware of the fact that at the present time anybody is carrying out electroless deposition (for semiconductor fabrication) near or at 100° C. (boiling point of water at 1atm). It should be noted however, that for many materials deposition at about 100° C. (or at least at about 25% below that temperature) may significantly improve not only characteristics of the process (e.g., the deposition rate) but also properties of the electrolessly deposited films.

In fact, the only limitation of the upper temperature limit is the temperature that may cause decomposition or irreversible changes in properties of the organic components of the deposition solution. Therefore the specific maximum temperature of the process is selected with reference to the aforementioned limitations. Increase in the deposition rate can be obtained merely due to an increased pressure, even if the process is carried out at room temperature.

The apparatus for realization of the method of the invention comprises a closable chamber that can be sealed and is capable of withstanding an increased pressure, e.g., up to 2 atmospheres or higher, or a reduced pressure, e.g., down to 0.1 atmospheres. The chamber contains a substrate holder, which can be rotated around a vertical axis, and an edge-grip mechanism located inside the substrate holder for rotation therewith. In addition to rotation, the edge-grip mechanism can be shifted in a vertical direction inside the deposition chamber for receiving a substrate from a loading device and for placing it in the holder. The deposition chamber has several inlet ports for the supply into the chamber of various process liquids, such as deposition solutions, DI water for rinsing, cleaning solutions, and a port for the supply of a neutral gas, e.g., $N_2$ under pressure for pressurization of the chamber interior. The liquids and gases are removed through respective exhaust ports. The apparatus is also provided with reservoirs and tanks for processing liquids and gases, as well as with solution heaters and a control system for controlling temperature and pressure in the chamber. Rotation of the substrate holder and a provision of a special shower system in the upper cover of the deposition chamber ensure uniform wetting of the substrate prior to the supply of the deposition solution. The solution is supplied via a deposition solution shower head which also is formed in the upper cover, while the rinsing or other auxiliary solutions are supplied via a radially moveable chemical dispensing arm arranged above the substrate parallel thereto.

DETAILED DESCRIPTION OF THE INVENTION

Figure 1:
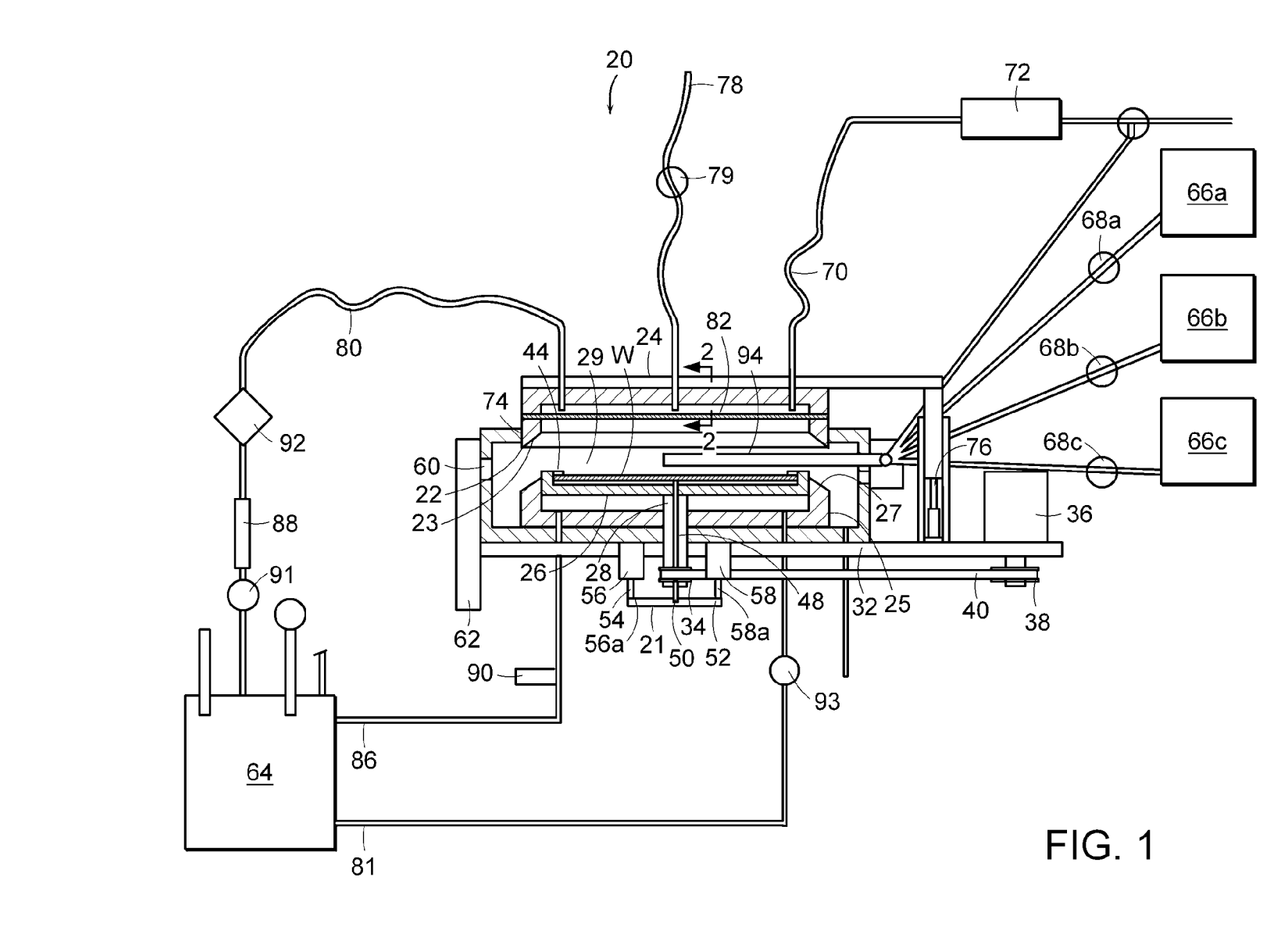
FIG. 1 is a schematic view of an electroless apparatus made in accordance with one embodiment of the invention.

The electroless-plating apparatus of the invention, which is schematically shown in FIG. 1 and is designated as a whole by reference numeral 20, has a electroless-plating chamber 22 (hereinafter referred to as "chamber 22") that can be hermetically closed with a cover 24 located above the chamber 22. In a closed state, the chamber 22 may withstand increased pressures and is provided with appropriate seals (not shown) between the connected parts, such as cover, chamber, ports, feedthrough devices, fittings, etc. More specifically, the pressure that can be developed inside the chamber 22 may reach 2 atmospheres above the atmospheric pressure or be reduced below the atmospheric pressure, e.g., down to 0.1 atmospheres.

The chamber 22 is either made of or has the inner surface coated with a chemically stable material that can withstand the action of aggressive solutions used in the operation process of the apparatus 20 under high temperatures and under high pressures. Examples of such materials are Teflon, ceramics of certain types, or the like.

The chamber 22 contains a substrate holder 26, which can be rotated inside the chamber 22 by a shaft 28 that is attached to the lower side 30 of the substrate holder 26. The shaft 28 sealingly passes through the bottom 32 of the chamber 22 and rigidly support on its outer end a gear wheel 34. This gear wheel 34 is driven into rotation from a motor 36 via another gear wheel 38 on the output shaft of the motor 36. The gear wheels 34 and 38 are interconnected via a synchronization belt 40.

The substrate holder 26 has a plate-like shape and is provided with an edge-grip mechanism 44 located in the upper part of the substrate holder for gripping, fixing, and supporting a substrate W placed onto the upper surface of the edge-grip mechanism 44.

The shaft 28 has a central through hole 48. A rod 50 is sealingly and slidingly inserted into the chamber 22 via the hole 48. The upper end of the rod 50 is rigidly connected to the bottom of the edge-grip mechanism 44, while the lower end of the rod 50 is connected to a cross beam or plate 52 located on the outer side of the apparatus 20 via a bearing 21. The plate 52, in turn, is connected to a linear drive mechanism 54, which in the embodiment shown in FIG. 1 is made in the form of a couple of pneumatic cylinders 56 and 58 having their respective piston rods 56a and 58a rigidly connected to the plate 52.

The chamber 22 has a wafer loading port 60 that can be opened or closed by a gate mechanism 62. The loading port 60 is opened when the cover 24 is lifted for loading a wafer W into the substrate holder 26 via the port 60, e.g., with a mechanical arm of the robot (not shown) that can be installed outside the apparatus 20 with the position of the mechanical arm aligned with the loading port 60.

Arranged around the apparatus 20 are control and auxiliary devices shown in FIG. 1. It is understood that these devices are shown as examples, since the types and characteristics of these devices will depend on specific purpose and functions of the apparatus.

In the embodiment shown in FIG. 1 the auxiliary system contains a group of tanks for solutions and gases. Reference numeral 64 designates a deposition solution supply tank. Reference numerals 66a, 66b, 66c designate chemical supply tanks for storing various chemical reagents required for the electroless deposition, as well as rinsing solutions, including deionized water for final rinsing. Reference numerals 68a, 68b, 68c designate solenoid valves that open and close connection of tanks 66a, 66b, 66c with the interior of the chamber 22.

Reference numeral 70 designates a pipeline for the supply of a rinsing solution to the chamber 22 via the cover 24. On the way to the chamber 22, the rinsing solution can be heated with the use of a heater 72.

The cover 24 is slidingly and sealingly installed in a guide opening 74 formed in the upper part of the chamber 22. The cover can be moved mechanically, e.g., by a pneumatic cylinder 76. In view of mobility of the cover 24, the pipeline 70, as well as other below-described hydraulic and pneumatic connections with the cover, are made in the form of hoses or other flexible pipings. The lower edge of the cover 24 is beveled at 23.

The bottom 32 of the chamber 22 rigidly supports a cup-shaped cover support 25, which is open upward. The upper edge 27 of the cover support 25 is also beveled to match the edge 23 of the cover and to form an additional closed space defined by the cover 24 and the cup-shaped cover support 25. When the cover 24 moves down, the edge 23 rests onto the edge 27.

The aforementioned other pipings include a compressed gas supply line 78, e.g., for the supply of gaseous nitrogen into the interior of the chamber 22, and a deposition solution line 80 for the supply of the deposition solution from the tank 64 to a shower head 82. Reference numeral 79 designates a pressure sensor for measure inner pressure of gas in the chamber 22.

As explained in more detail below in reference to FIGS. 2A and 2B, the shower head is formed on the tapered inner surface of the cover 24 in the form of a manifold 83 with a single inlet and a plurality of outlet openings arranges in series along the ridge of the roof-like profile. Only one such outlet opening 84 is shown in FIGS. 2A and 2B, since other openings are arranged in the direction perpendicular to the plane of FIGS. 2A and 2B.

Figure 2A:
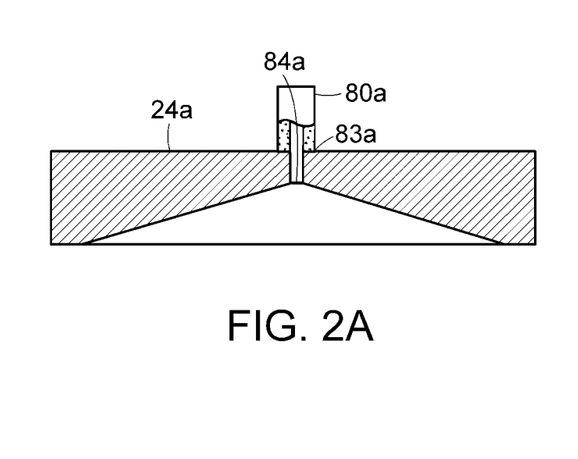
FIGS. 2A is a cross-sectional view of the cover along the line II-II of FIG. 1 with the inner tapered surface of the cover tapered upward.
Figure 2B:
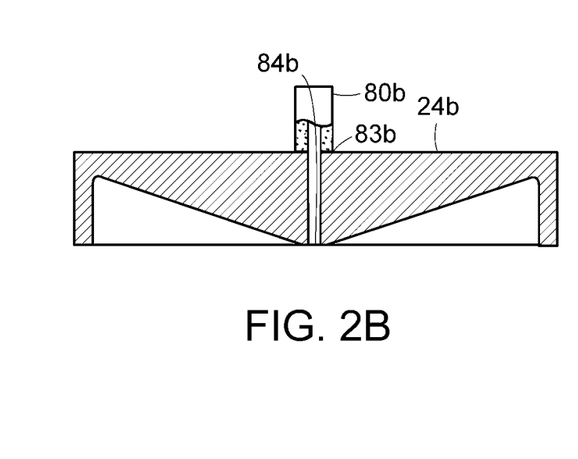
FIG. 2B is a view similar to FIG. 2A with the inner tapered surface of the cover tapered downward.

As shown in FIGS. 2A and 2B, which are cross-sectional shapes of the cover 24 along the line II-II of FIG. 1, the inner tapered surface of the cover may have a profile tapered upward, as shown in FIG. 2A, or tapered downward, as shown in FIG. 2B. The tapered profile is needed to prevent accumulation of drops of the solution that may drip onto the wafer W after the final treatment.

Returning to FIG. 1, chamber 22 is also provided with another deposition solution supply line 81, which goes from the tank 64 to the bottom 32 of the chamber 24 for the supply of the deposition solution by a pump 93 to the chamber 24 from below. Such a supply may be required in some cases to provide more favorable conditions for application of the deposition solution onto the surface of the substrate W. This is because, even though the shower head 83 prevents formation of drops, in the initial stage of filling of the chamber the supply of the solution from above may cause non-uniform distribution of the solution over the surface of the substrate W because of discrete arrangement of outlet openings 84a or 84b, as shown in FIGS. 2A and 2B.

From the interior of the chamber 22, the solution returns to the tank 64 for recirculation via a solution return line 86. The temperature control is carried out by means of a temperature control unit 88, while the temperature of the solution is constantly measured with the use of a temperature sensor 90 installed in the solution return line 86. Reference numeral 91 designates a pump unit, and 92 designates a filter.

Figure 3:
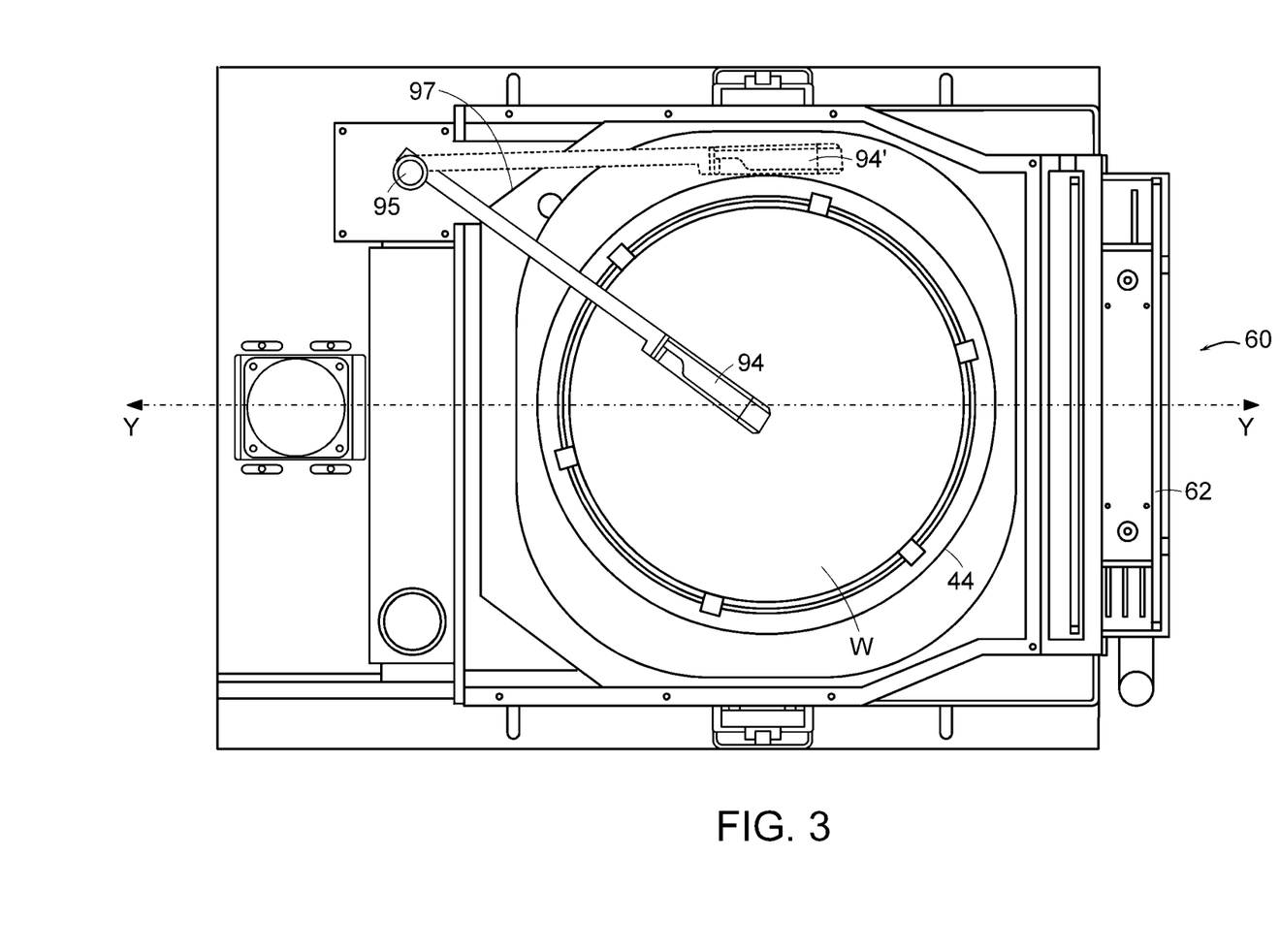
FIG. 3 is a top view of the substrate W fixed in the edge-grip mechanism.

Another essential device of the apparatus 20 of the invention is a chemical dispensing arm 94. FIG. 3 is a top view of the substrate W fixed in the edge-grip mechanism 44. The chemical dispensing arm 94 is normally located outside the chamber 22, e.g., in the position 94' shown by broke lines in FIG. 3. For this purpose, the outer end of the chemical dispensing arm 94 is connected to a respective rotary drive mechanism (not shown) for swinging motions of the arm 94 around an axis 95 from the position shown by broke lines to the position shown by solid lines.

Outlet openings 84a and 84b (only one of which is shown in FIG. 2A and FIG. 2B, respectively) of manifolds 83a and 83b, respectively, shown in FIGS. 2A and 2B, are arranged along the axis Y-Y shown in FIG. 3. In its working position shown in FIG. 3 by solid lines, the dispensing arm 94 is arranged about 45 degrees to axis Y-Y. Non-working position of the arm 94 outside the chamber 22 is shown in FIG. 3 by broken lines (reference numeral 94'). Position of the loading port 60 is also shown in FIG. 3.

It should be noted that the closed position of the cover 24, when it is rests onto the cover support 25, does not interfere with the operation of the dispensing arm 94 due to a provision of a window 97 in the cover 24 (FIG. 3). Positions of the dispensing arm can be controlled for delivering a required fluid to a specific area of the wafer.

Figure 4:
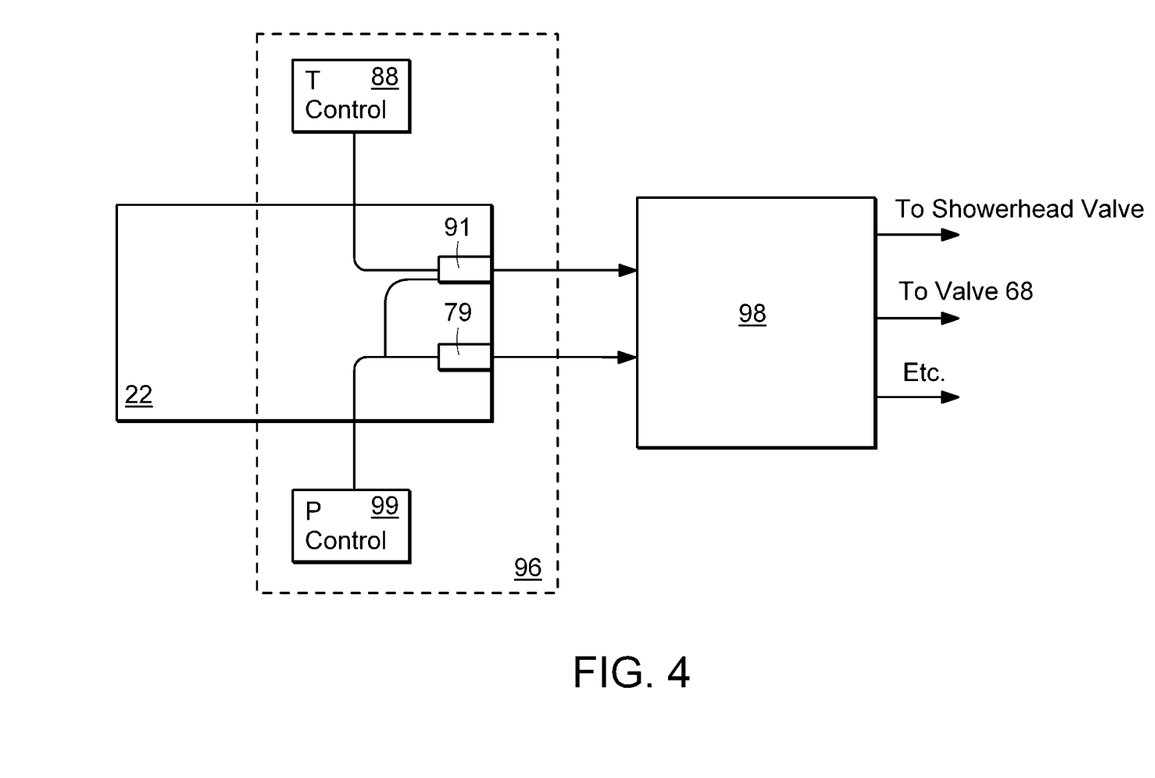
FIG. 4 is a schematic block diagram of a temperature and pressure control system of the apparatus of the invention.

FIG. 4 is a schematic block diagram of a temperature and pressure control system of the apparatus 20. The process chamber 22 is connected to a deposition solution subsystem 96 which includes all control and operation mechanisms associated with the supply, heating, and parameter control of the deposition solution (the tank 64, pump 91, heater 88, temperature sensor 90, shower-head manifold 83, gas supply line 78, and gas pressure sensor 79).

The entire control of all the systems, subsystems, and mechanisms is carried out from a central processing unit (CPU) 98, e.g., a personal computer having feedback with controllers of actuation mechanisms. Pressure control unit 99 is coupled to pressure control sensor 79 and the pump 91.

Figure 5A:
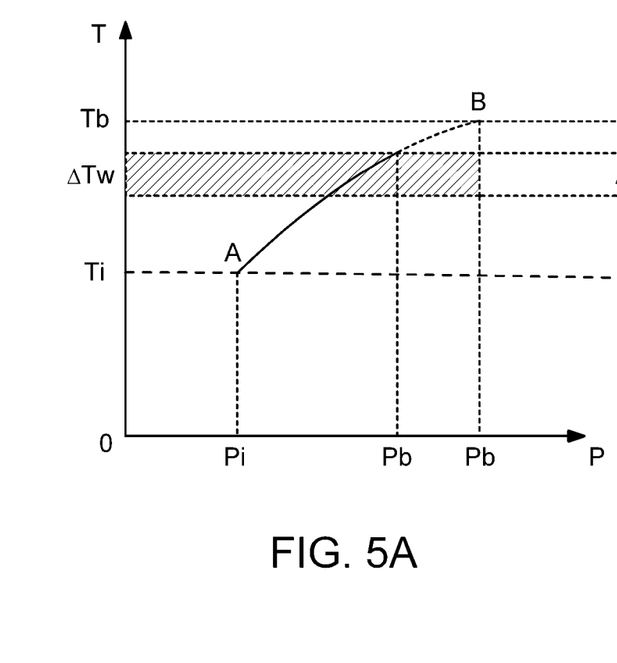
FIG. 5 is a graph illustrating temperature-pressure control of the deposition solution in the working chamber during the deposition process.
Figure 5B:
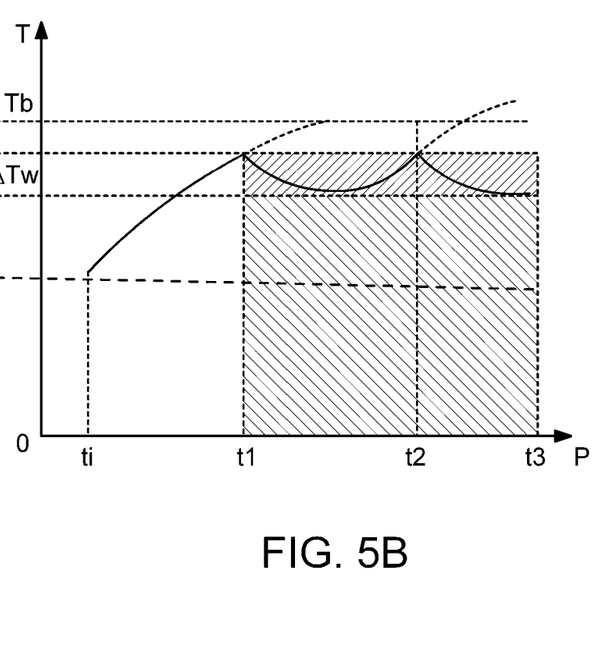

FIGS. 5A and 5B are graphs illustrating temperature-pressure control of the deposition solution in the chamber 22 during the deposition process. FIG. 5A shows a pressure-temperature relation, and FIG. 5B shows variation of temperature in time. As can be seen from FIG. 5A, starting from a point A corresponding to an initial temperature $T_i$ the temperature of the solution is increased by heating with the heater 88 simultaneously with an increase of pressure $P_i$ with the use of the pump 91. When the temperature increase reaches the boiling point (point B in FIG. 5A), further increase in temperature is possible only with the increase in pressure. This is because at a predetermined pressure the solution has a constant value of the boiling point $T_B$. Since the boiling conditions are not favorable for the deposition (due to the formation of randomly distributed gas bubbles in a heterogeneous gas/liquid system or due to a risk of decomposition of some components in the deposition solution), the temperature control system of the heater 88 will reduce the temperature of the solution below the boiling point $T_B$ in order to eliminate the bubbles and prevent decomposition. Such a decrease can be within the range from 0 to 25% below the boiling point In FIG. 5A the working temperature/pressure area is hatched. During the deposition process, the working temperature $T_w$ is constantly maintained below the boiling point $T_B$ and below the value critical from the point of view of decomposition.

As can be seen from FIG. 5B, which shows variation of the temperature in time, during the working cycle of the apparatus, the temperature of the solution is automatically maintained at $T_w$ point level and is practically constant. Such control makes it possible to immediately stabilize the temperature of the solution in the entire volume of the deposition chamber 22. This is because near the boiling point, the temperature of the solution will be maintained at constant level, which is determined only by the pressure. On the other hand, pressure can be controlled and maintained at a required level, since in compliance with the Pascal law the pressure is uniform over the entire volume of the chamber 22. In other words, the deposition process will occur under conditions of well-stabilized temperature.

For electroless deposition of a predetermined thin-film coating onto the surface of a substrate W in the apparatus 20 of the invention, the cover 24 of the apparatus 20 is raised, and a substrate W is placed onto an edge-grip mechanism 44 of the substrate holder 26 manually or via the loading port 60 by means of an mechanical arm of a robot (not shown) that can be located near the apparatus 20 or be a part of this apparatus. After the substrate is clamped in place by the gripping mechanism 44, the cover 24 goes down so that the edge 23 of the cover 24 rests onto the edge 27 of the cover support 25. Closing of the cover 24 is carried out by means of the mechanism 76. The entire chamber 22 is sealed after the gate 62 is closed. The edge-grip mechanism 44 descends into the plate-like body of the substrate holder 26. Descending of the edge-grip mechanism 44 is carried out with the use of pneumatic cylinders 56 and 58.

The substrate holder 26 and the edge-grip mechanism 44 located therein and supporting the substrate W begin to rotate from the motor 36 via the synchronization belt 40 and respective gear wheels 34 and 38. At the same time, a working solution is supplied to the chamber via the shower head 82 with uniform distribution of the solution over the surface of the substrate W and within the chamber 22.

If necessary, the deposition solution may be supplied to the chamber 22 through the chamber bottom 32 from the solution tank 64 by the pump 93 via the line 81.

During the supply of the solution, the latter is subjected to heating with the heater 88, and pressure in the chamber 22 is increased by supplying a neutral gas, e.g., $N_2$, to the chamber 22. All these operations are performed under the control of CPU 98 (FIG. 4). Immediately after filling is completed, the temperature of the solution reaches the boiling point $T_B$ (FIGS. 5A and 5B). The heater 88 is switched off or the power of the heater is reduced to maintain the temperature at near-boiling point level, e.g., within the range from 0 to 25% below the boiling point. The temperature is constantly adjusted for keeping it an essentially constant level, as shown in FIG. 5B. As a result, the electroless deposition is carried out with a very high uniformity. During operation, the solution circulates by returning to the tank 64 via the return line 86 and then back to the chamber 22 by the pump 91 via the heater 88, filter 92, supply line 80, and the shower-head manifold 83.

In fact, the deposition process is carried out in the additional closed space 29 defined by the cover 24 and the cover support 25. During operation, the substrate holder 26 with the edge-grip mechanism 44 and wafer W in it are located in the aforementioned closed space.

Upon completion of the deposition operation, the supply of the solution by the pump 91 is discontinued, the solution returns to the tank 64, and the CPU 98 (FIG. 4) sends a command to a respective controller for activation of an appropriate unit, such as, e.g., the supply of water for rinsing, or the supply of another treatment or neutralization solution, etc. It is understood that in that case the CPU sends the commands for closing some of the solenoid valves, opening other valves, and activating other appropriate mechanisms known in the art.

Figure 6:
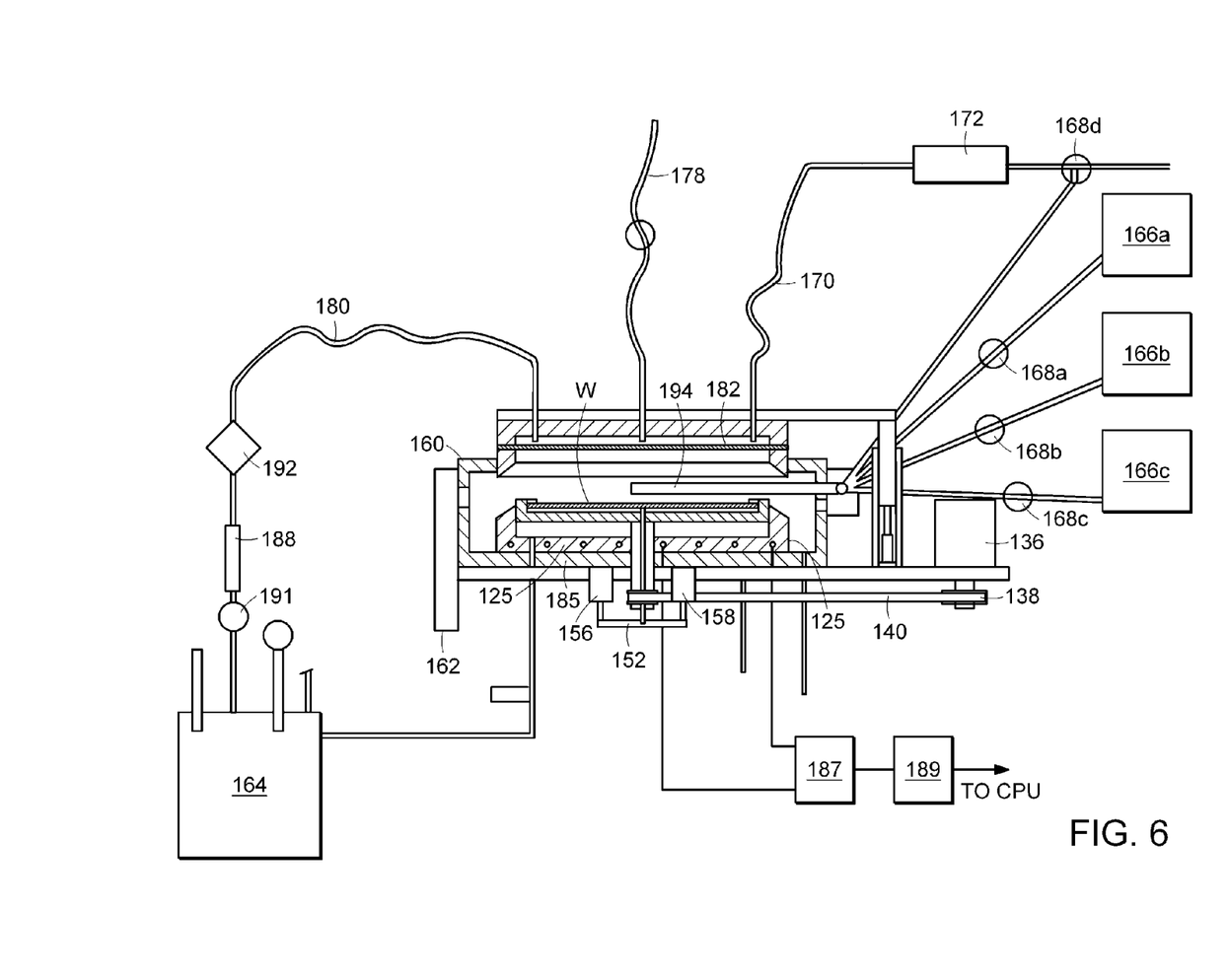
FIG. 6 is a schematic view of the apparatus made in accordance with another embodiment of the invention.

FIG. 6 is a schematic view of the apparatus 120 made in accordance with another embodiment of the invention. In fact, the apparatus 120 is substantially identical to the apparatus 20 shown and described with reference to FIGS. 1 through 5 and differs from the apparatus 20 only by the fact that the solution heater 185 is built into the bottom of the cover support 25. Reference numeral 187 designates a heater power supply and reference numeral 189 designates a controller connected to the CPU (not shown). The rest of the apparatus 120 is identical to respective units of the apparatus 20. Therefore some of the units of the apparatus 120 are designated by the same reference numerals with an addition of 100, but description thereof is omitted.

Thus it has been shown that the invention provides an apparatus and method for electroless plating of thin uniform films at high temperatures with high uniformity of the deposited layers, and with high speed of deposition. The invention also provides an electroless deposition apparatus which is simple and compact in construction, inexpensive to manufacture, universal in use due to accommodation of various processes such as cleaning, etching, activation, hot DI flushing, evacuation, purging, chamber draining, wafer drying, etc. The electroless-deposition process is carried out at a temperature slightly below the boiling point of the solution and at a specific increased pressure inside the operation chamber of the apparatus.

The invention has been shown and described with reference to a specific embodiment which should be construed only as an example and does not limit the scope of practical applications of the invention. Therefore any changes and modifications in technological processes, constructions, materials, shapes, and their components are possible, provided these changes and modifications do not depart from the scope of the patent claims. For example, the apparatus may normally operate with the provision of the cover support. The chamber 24 may have any convenient shape. For example, it can be cylindrical or semi-spherical. The apparatus may have two or more identical deposition chambers connected in series. The deposition solution may be an aqueous solution, a non-aqueous solution, a molten salt, etc. The solution can be supplied simultaneously from the shower head and from bottom. The process can be carried out at room temperature and under normal pressure or under pressure below the atmospheric. The edge-gripper and the cover can be driven from hydraulic or mechanical drive mechanisms. The process can be carried with deposition of metal as well as non-metal films. The heater can be built into the walls of the housing.

The invention claimed is:

1. A method for electrolessly depositing a layer upon a microelectronic, comprising:
    loading the microelectronic topography into an electroless deposition chamber;
    closing the electroless deposition chamber;
    joining a cover and a cup-shaped cover support within the electroless deposition chamber to form a sealed enclosed area about the microelectronic topography such that fluids are inhibited from leaking from the sealed enclosed area;
    filling the sealed enclosed area with an electroless deposition solution;
    electrolessly depositing a layer on the microelectronic topography from the electroless deposition solution;
    pressurizing the sealed enclosed area with a gas during the step of filling the sealed enclosed area with the electroless deposition solution; and
    heating the electroless deposition solution in the electroless deposition chamber to its boiling point and subsequently reducing the temperature of the electroless deposition solution to a working temperature range, wherein the working temperature range spans between approximately 1% and approximately 25% below the boiling point of the electroless deposition solution.

2. The method of claim 1, wherein the step of pressurizing the sealed enclosed area comprises pressurizing the sealed enclosed area to a pressure between approximately 0.1 atm and approximately 3 atm.

3. The method of claim 2, further comprising heating the electroless deposition solution to a temperature less than approximately 25% below the boiling point of the electroless deposition solution at said pressure during the step of filling the sealed enclosed area.

4. The method of claim 3, further comprising maintaining the electroless deposition solution within a temperature range between approximately 1% to approximately 25% below the boiling point of the electroless deposition solution at said pressure during said electrolessly depositing the layer upon the microelectronic topography.

5. The method of claim 1, wherein the cup-shaped cover support is rigidly supported by the bottom of the electroless deposition chamber.

6. The method of claim 1, wherein an upper edge of the cup-shaped cover support is beveled to match an edge of the cover so that the edge of the cover rests on the upper edge of the cup-shaped cover support, forming the sealed enclosed area when the cover moves down.

7. The method of claim 1, wherein the cover has an inner tapered profile.

8. A method for electrolessly depositing a layer upon a microelectronic, comprising:
   loading the microelectronic topography into an electroless deposition chamber;
   closing the electroless deposition chamber;
   joining a cover and a cup-shaped cover support within the electroless deposition chamber to form a sealed enclosed area about the microelectronic topography such that the sealed enclosed area can withstand a development of pressure up to approximately 3 atm;
   filling the sealed enclosed area with an electroless deposition solution;
   electrolessly depositing a layer on the microelectronic topography from the electroless deposition solution;
   pressurizing the sealed enclosed area with a gas during the step of filling the sealed enclosed area with the electroless deposition solution; and
   heating the electroless deposition solution in the electroless deposition chamber to its boiling point and subsequently reducing the temperature of the electroless deposition solution to a working temperature range, wherein the working temperature range spans between approximately 1% and approximately 25% below the boiling point of the electroless deposition solution.

9. The method of claim 8, wherein the step of pressurizing the sealed enclosed area comprises pressurizing the sealed enclosed area to a pressure between approximately 0.1 atm and approximately 3 atm.

10. The method of claim 9, further comprising heating the electroless deposition solution to a temperature less than approximately 25% below the boiling point of the electroless deposition solution at said pressure during the step of filling the sealed enclosed area.

11. The method of claim 10, further comprising maintaining the electroless deposition solution within a temperature range between approximately 1% to approximately 25% below the boiling point of the electroless deposition solution at said pressure during said electrolessly depositing the layer upon the microelectronic topography.

12. A method for electrolessly depositing a layer upon a microelectronic, comprising:
   loading the microelectronic topography into an electroless deposition chamber;
   closing the electroless deposition chamber;
   joining a cover and a cup-shaped cover support within the electroless deposition chamber to form a sealed enclosed area about the microelectronic topography such that fluids are inhibited from leaking from the sealed enclosed area;
   filling the sealed enclosed area with an electroless deposition solution;
   electrolessly depositing a layer on the microelectronic topography from the electroless deposition solution;
   pressurizing the sealed enclosed area with a gas during the step of filling the sealed enclosed area with the electroless deposition solution; and
   heating the electroless deposition solution while filling the sealed enclosed area, wherein the steps of filling the sealed enclosed area, pressurizing the sealed enclosed area, and heating the electroless deposition solution are configured such that the electroless deposition solution reaches its boiling point immediately after the sealed enclosed area is filled.

13. A method for electrolessly depositing a layer upon a microelectronic, comprising:
   loading the microelectronic topography into an electroless deposition chamber;
   closing the electroless deposition chamber;
   joining a cover and a cup-shaped cover support within the electroless deposition chamber to form a sealed enclosed area about the microelectronic topography such that the sealed enclosed area can withstand a development of pressure up to approximately 3 atm;
   filling the sealed enclosed area with an electroless deposition solution;
   electrolessly depositing a layer on the microelectronic topography from the electroless deposition solution;
   pressurizing the sealed enclosed area with a gas during the step of filling the sealed enclosed area with the electroless deposition solution; and
   heating the electroless deposition solution while filling the sealed enclosed area, wherein the steps of filling the sealed enclosed area, pressurizing the sealed enclosed area, and heating the electroless deposition solution are configured such that the electroless deposition solution reaches its boiling point immediately after the sealed enclosed area is filled.

* * * * *